United States Patent
Lo et al.

(10) Patent No.: US 8,837,808 B2
(45) Date of Patent: *Sep. 16, 2014

(54) METHOD OF FINAL DEFECT INSPECTION

(71) Applicant: Kinsus Interconnect Technology Corp., Taoyuan (TW)

(72) Inventors: Chia-Chi Lo, Taoyuan County (TW); Cheng-Hsiung Yang, Hsinchu (TW); Jun-Chung Hsu, Taoyuan County (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 69 days.

This patent is subject to a terminal disclaimer.

(21) Appl. No.: 13/721,015

(22) Filed: Dec. 20, 2012

(65) Prior Publication Data

US 2014/0177939 A1    Jun. 26, 2014

(51) Int. Cl.
*G06K 9/00* (2006.01)
*G06T 7/00* (2006.01)

(52) U.S. Cl.
CPC .................................. *G06T 7/0004* (2013.01)
USPC ...................................... 382/147; 356/237.5

(58) Field of Classification Search
CPC ..................................................... G06T 7/0004
See application file for complete search history.

(56) References Cited

U.S. PATENT DOCUMENTS

| | | | |
|---|---|---|---|
| 5,204,912 A * | 4/1993 | Schimanski | 382/147 |
| RE35,423 E * | 1/1997 | Adams et al. | 378/58 |
| 6,021,380 A * | 2/2000 | Fredriksen et al. | 702/35 |
| 8,547,548 B1 * | 10/2013 | Lo et al. | 356/237.5 |
| 2002/0083581 A1 * | 7/2002 | Huber | 29/740 |
| 2010/0122634 A1 * | 5/2010 | Doyle | 101/126 |

* cited by examiner

*Primary Examiner* — Samir Ahmed
(74) *Attorney, Agent, or Firm* — Lin & Associates IP, Inc.

(57) ABSTRACT

Disclosed is a method of final defect inspection, including preparing a final defect inspection apparatus which includes a host device, a microscope, a bar code scanner, a support tool and a signal transceiver, using the host device to calibrate an original point in an outline of the circuit board based on a plurality of original mark positions generated by an electromagnetic pen, using the electromagnetic pen to mark each defect position on the inspection region on the circuit board where any defect is found through the microscope, using the signal transceiver to receive and transmit each defect position to the host device, and using the host device to calculate the coordinate of a scrap region based on a relative position between the original point and each defect position so as to generate a shipment file.

14 Claims, 7 Drawing Sheets

METHOD OF FINAL DEFECT INSPECTION

BACKGROUND OF THE INVENTION

1. Field of the Invention

The present invention generally relates to a method of final defect inspection, and more specifically to a method of final defect inspection using a signal transceiver to directly mark each defect position by intuition so as to avoid mark error.

2. The Prior Arts

A traditional final inspection for circuit boards as a final check for shipping is performed after optical inspection by manually and visually inspecting the inspection regions preset on each circuit board through the microscope or magnifying glass. In the current manual processes, the operator usually uses a black pen or white paint pen to mark a scrap region where any defect is found. Each marked scrap region is provided for the subsequent laser marking process after the drying process, and used to generate the electronic file for recoding each defect. However, there are several problems occurring when the defect record is implemented by the electronic file. Firstly, automatic process and management are not implemented and potential risk always exists in the manual inspection because the operator needs to open the layout diagram with respect to the circuit board and simultaneously input the position of the scrap region to the computer. Secondly, as the circuit board becomes finer and more compact, the number of the inspection regions on the circuit board increases and the operator has to inspect several columns and rows of the inspection regions such that some of the manually marked positions do deer not match those input to the computer. Thirdly, the mark manually specified for the scrap region by the traditional black pen and white paint pen tends to fall off and thus possibly causes serious pollution for the circuit board.

In general, the circuit boards through the final inspection will be delivered to the customer. If there are some defective circuit boards not excluded in the final inspection, the final products using the defective circuit boards become scrap products due to the mismatched record for the defect marks and serious pollution from the fallen marks. As a result, the customer may suffer significant loss and the credit in the market will be adversely influenced. Therefore, it needs a new method of final defect inspection to reduce the time of inspection and avoid mark error so as to overcome the problems in the prior arts.

SUMMARY OF THE INVENTION

Therefore, the present invention has been made in view of the above problems, and it is an object of the present invention is to provide a method of final defect inspection, which comprises the steps of preparing a final defect inspection apparatus, scanning a bar code, calibrating an original point, inspecting any defect, marking the defect, and generating a shipment file. In the step of preparing the final defect inspection apparatus, the final defect inspection apparatus generally comprises a host device having a database, a microscope, a bar code scanner connected to the host device, a support tool for supporting a circuit board to be inspected, and a signal transceiver provided on the support tool and electrically connected to the host device.

In the step of scanning the bar code, the bar code scanner is used to scan the bar code on the circuit board, and the host device selects data and a circuit layout diagram from the database corresponding to the bar code. In the step of calibrating the original point, an electromagnetic pen is used to scribe a diagonal line on the circuit board so as to generate a plurality of original mark positions, the signal transceiver receives and transmits the original mark positions to the host device, which defines an outline of the circuit board based on the original mark positions and the circuit layout diagram, and specifies one point on the circuit board as the original point.

In the step of inspecting the defect, the support tool provided with the circuit board and the signal transceiver is disposed on a support plate of the microscope, the support plate is moved, and an eye lens and at least one object lens of the microscope are used to inspect whether any defect exists in a plurality of inspection regions preset on the circuit board. The defect position where any defect is found is thus specified. In the step of marking the defect, the electromagnet pen is used to make a mark on each defect position, and the signal transceiver receives and transmits each defect position to the host device. In the step of generating the shipment file, the host device is used to calculate a coordinate of a scrap region based on a relative position between the original point and each defect position, and to generate the shipment file containing the coordinate of the scrap region.

Alternatively, the electromagnetic pen can be replaced by a signal transmitter combined with a foot pedal. Specifically, before the step of scanning the bar code, a step of apparatus calibration is performed by aligning a cross region seen from the microscope and the signal transmitter, and then stamping the foot pedal. Thus, the microscope is positioned to correspond with the signal transmitter, and the signal transmitter transmits a positioning signal to the host device to finish apparatus calibration. Therefore, the process of seeing the cross region from the microscope and stamping the foot pedal can totally replace the process of making the mark on the defect position.

The present invention uses the host device, the bar code scanner, the signal transceiver and the electromagnetic pen to automatically read the data related to the circuit board and to calculate the marked defect position so as to avoid data input error and data mismatch problem for the marked position and the input data. Therefore, the traditional black pen or white paint pen is replaced and the risk of pollution for the processing pieces is improved.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENT

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1:
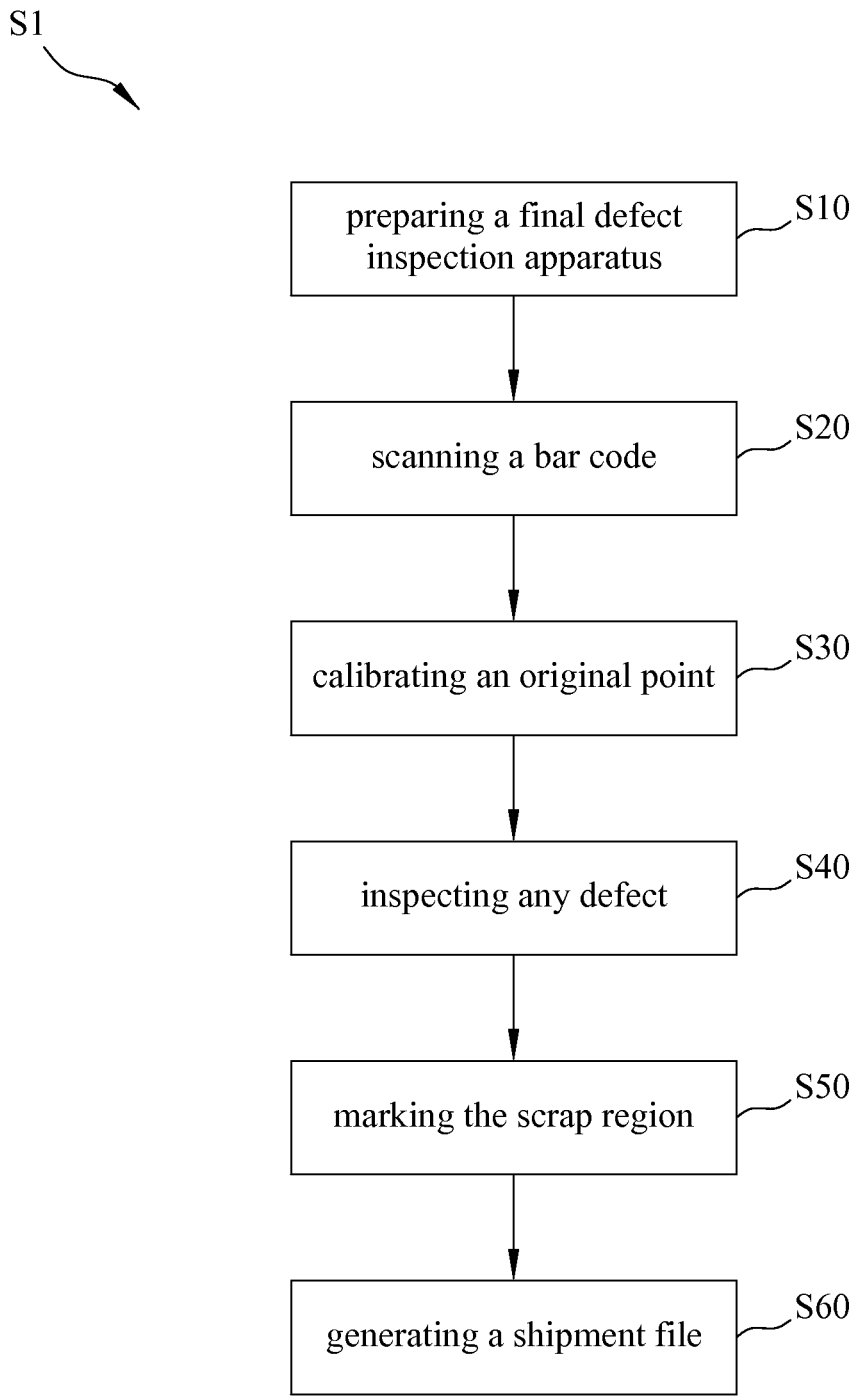
FIG. 1 shows the flow chart to illustrate the method of final defect inspection according to the first embodiment of the present invention.

Please refer to FIG. 1 for illustrating the flow chart of the method of final defect inspection according to the first embodiment of the present invention. As shown in FIG. 1, the method of final defect inspection of the first embodiment generally comprises the sequential steps of preparing a final defect inspection apparatus S10, scanning a bar code S20, calibrating an original point S30, inspecting any defect S40, marking the defect S50 and generating a shipment file S60.

Figure 2:
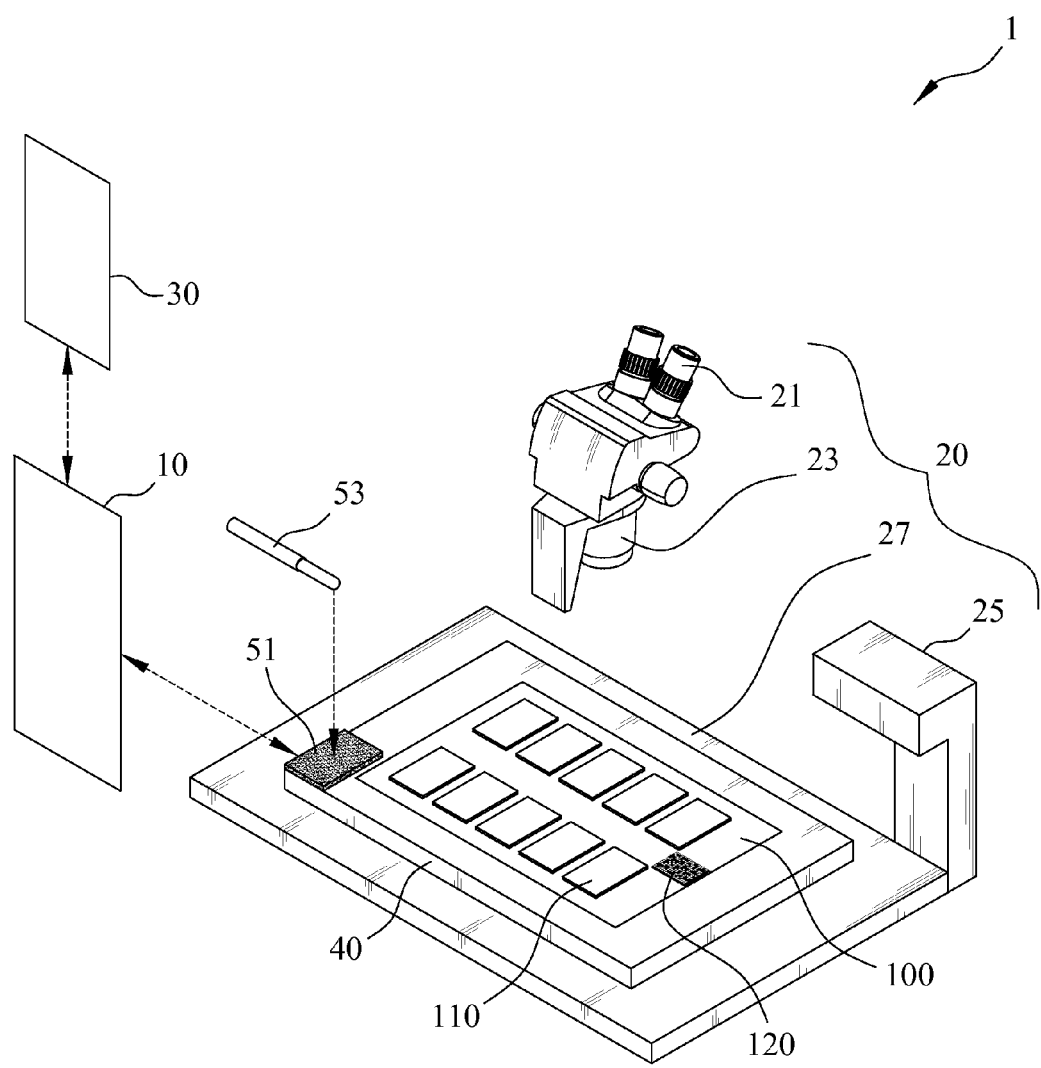
FIG. 2 is a view showing the final defect inspection apparatus used in the method according to the first embodiment of the present invention.

Meanwhile, refer to FIG. 2. In the step S10, the final defect inspection apparatus 1 to be prepared generally comprises a host device 10, a microscope 20, a bar code scanner 30, a support tool 40, a signal transceiver 51 and an electromagnetic pen 53.

The host device 10 has a database, which stores data (such as shipment ID, manufacturer, etc.) and layout diagrams. The microscope 20 is used to visually inspect the inspection regions 110 preset on the circuit board 100. The bar code scanner 30 is electrically connected to the host device 10. The support tool 40 is used to support a circuit board 100 to be inspected. The signal transceiver 51 is provided on the support tool 40 and electrically connected to the host device 10.

Figure 3:
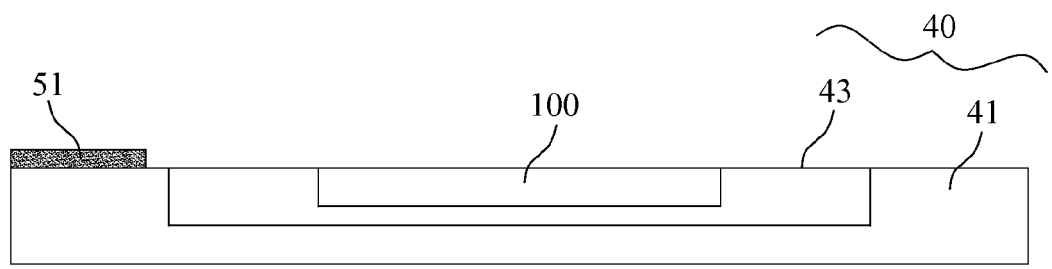
FIG. 3 is a cross-sectional diagram showing the support tool used in the method of the present invention.

Further refer to FIG. 3 for showing a cross-sectional view of the support tool 40 used in the method of the present invention. As shown in FIG. 3, the support tool 40 comprises a base 41 and a support piece 43. The base 41 has a recess part to accommodate the substrate plate 43, and similarly the support piece 43 has a recess part to support the circuit board 100. The substrate plate 43 can be replaced according to the size and shape of the circuit board 100, and the signal transceiver 51 is provided on the base 41.

In the step S20, the bar code scanner 20 is used to scan the bar code 120 on the circuit board 100, and the host device 10 selects data and a circuit layout diagram from the database corresponding to the bar code 120.

Figure 4:
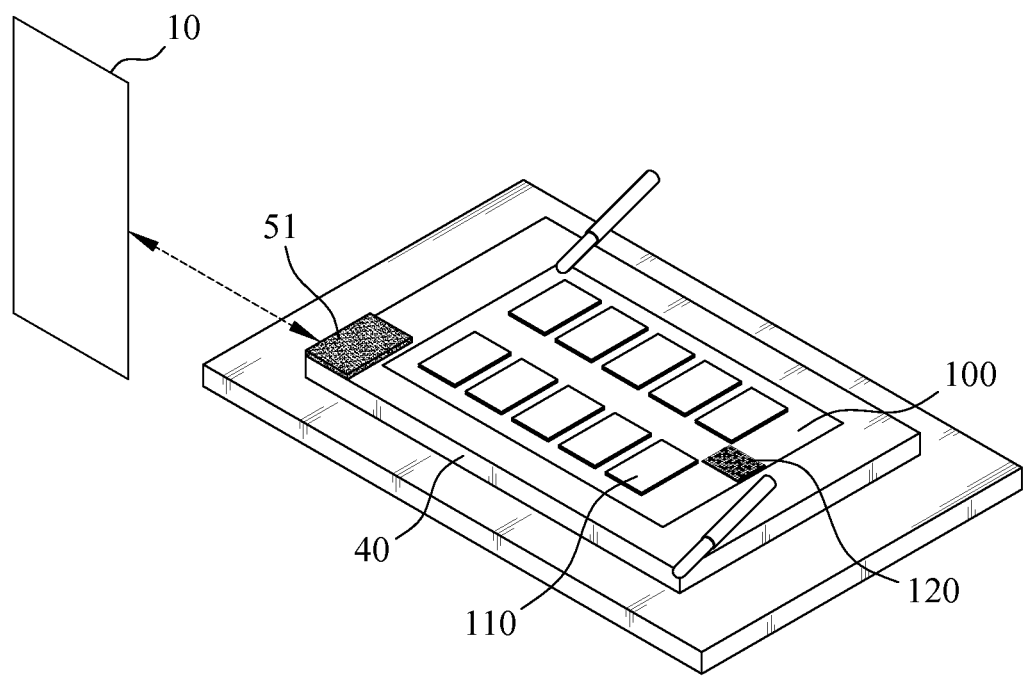
FIG. 4 is a view showing the electromagnetic pen scribing a diagonal line on the circuit board for marking.

As for the step S30, please refer to FIG. 4. The electromagnetic pen 53 is used to scribe a diagonal line on the circuit board 100 so as to generate a plurality of original mark positions. The signal transceiver 51 receives and transmits the original mark positions to the host device 10, which defines an outline of the circuit board 100 based on the original mark positions and the circuit layout diagram, and further specifies one point on the circuit board 100 as the original point.

In the step S40, the support tool 40 provided with the circuit board 100 and the signal transceiver 51 is disposed on a support plate 27 of the microscope 20. The support plate 27 is moved, and an eye lens 21 and at least one object lens 23 of the microscope 20 are used to inspect whether any defect exists in the inspection regions 110 preset on the circuit board 100. The defect position is the inspection region where any defect is found is thus specified. The eye lens 21 and the at least one object lens 23 are jointed to the support plate 27 through a support frame 25. Specifically, the eye lens has a magnification of 10× to 100×, and the at least one object lens has a magnification of 1× to 10×.

In the step S50, the electromagnet pen 53 is used to make a mark on each defect position, and the signal transceiver 51 receives and transmits each defect position to the host device 100. In the step S60, the host device 100 is used to calculate a coordinate of a scrap region based on a relative position between the original point and each defect position after all inspection regions are inspected, and then the host device 100 generates the shipment file containing the coordinate of the scrap region.

Additionally, the host device 10 is connected to the bar code scanner 30 and the signal transceiver 51 through wired or wireless connection, and the wireless connection is implemented by BLUETOOTH™ or wireless LAN (local area network). The signal transceiver 51 and the electromagnetic pen 53 are connected through wired or wireless connection, and preferably, the wireless connection is implemented by ultrasonic waves, BLUETOOTH™ or infrared rays.

Figure 5:
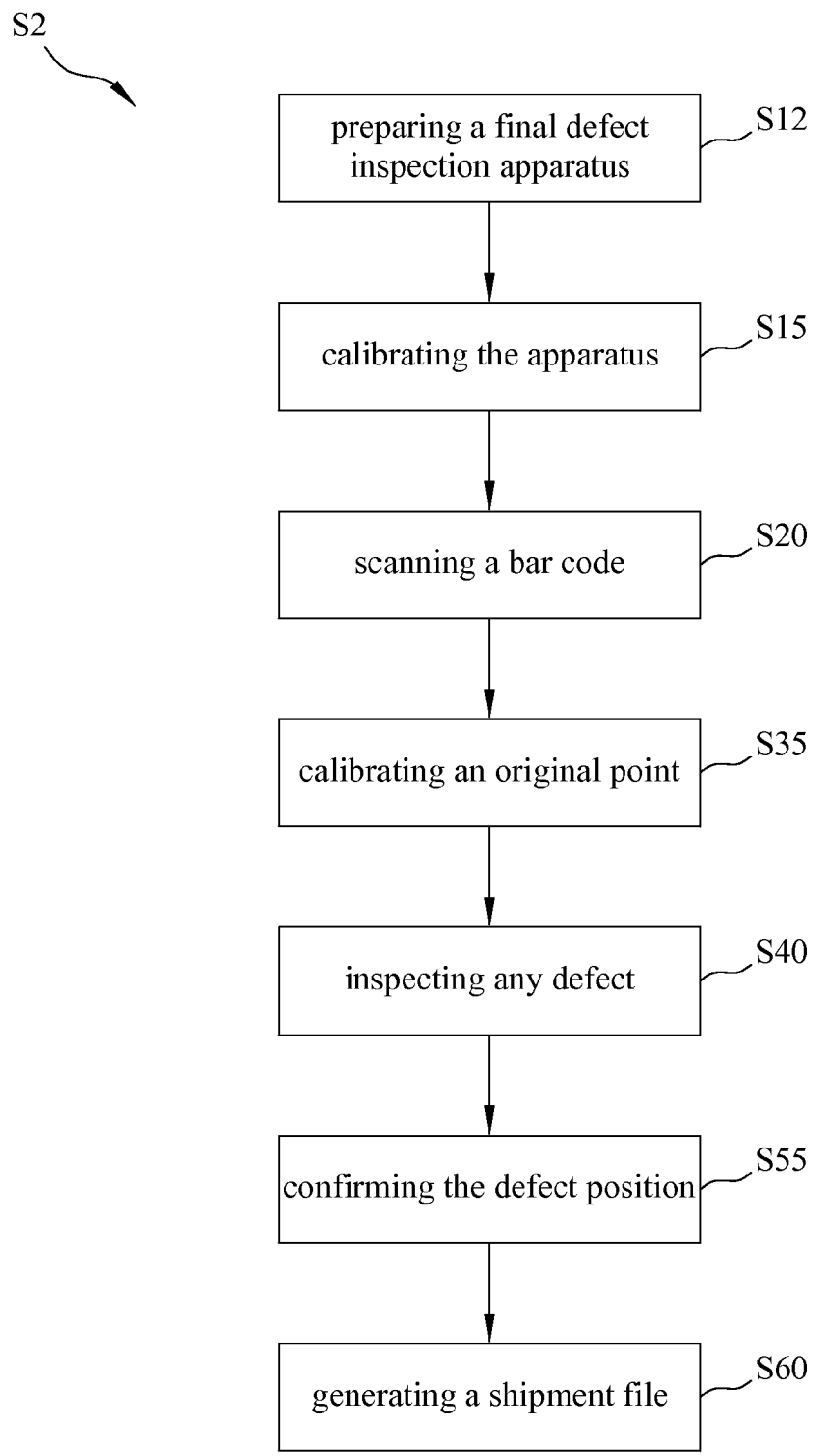
FIG. 5 shows the flow chart to illustrate the method of final defect inspection according to the second embodiment of the present invention.

Please refer to FIG. 5 for illustrating the flow chart of the method of final defect inspection according to the second embodiment of the present invention. As shown in FIG. 5, the method of the second embodiment generally comprises the sequential steps of preparing a final defect inspection apparatus S12, calibrating the final inspection apparatus S15, scanning a bar code S20, calibrating an original point S35, inspecting any defect S40, confirming the defect position S55 and generating a shipment file S60.

Figure 6:
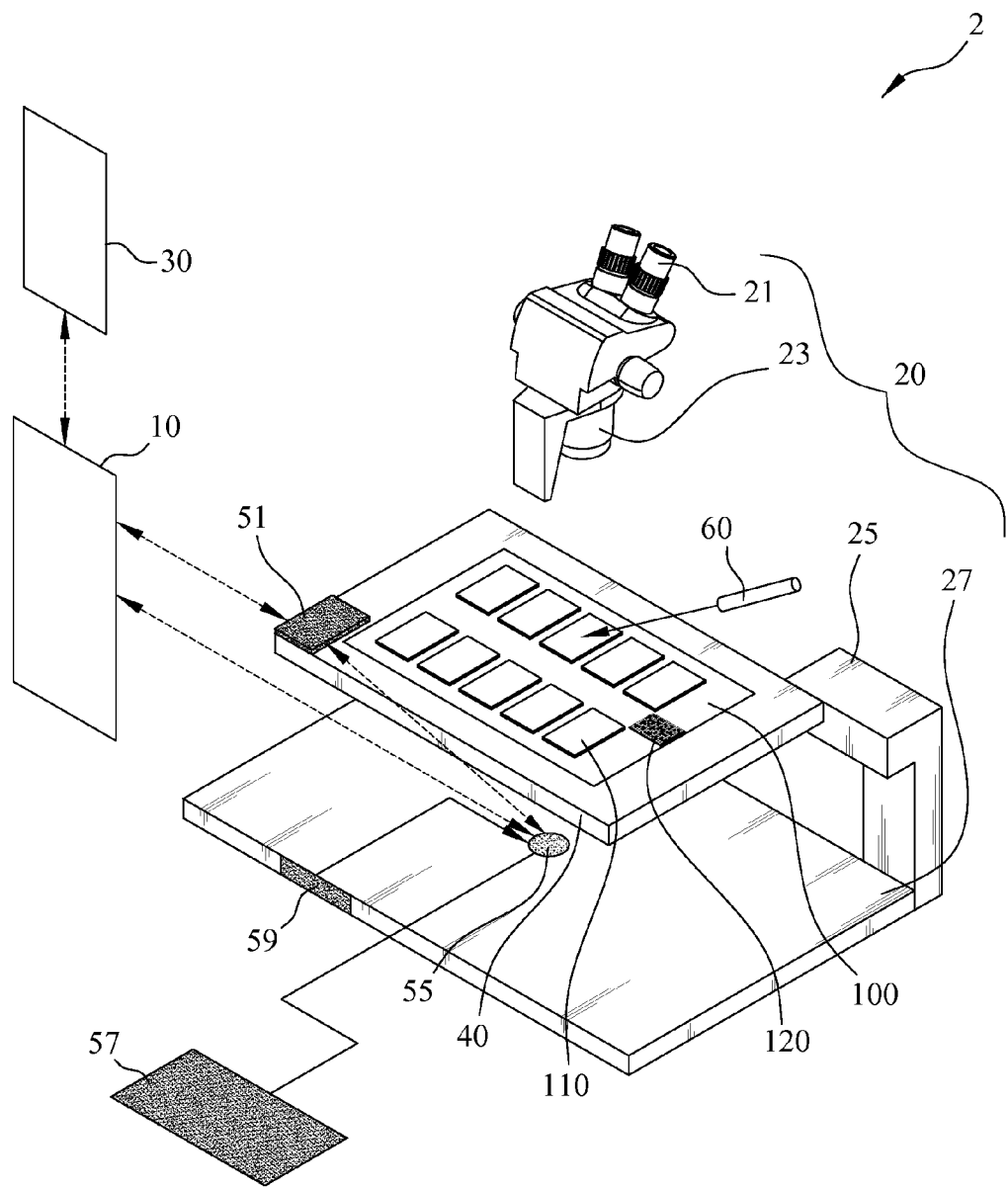
FIG. 6 is a view showing the final defect inspection device used in the method according to the second embodiment of the present invention.

Also, refer to FIG. 6 for showing the final defect inspection device used in the method according to the second embodiment of the present invention. In the step S12, the final defect inspection apparatus 2 to be prepared shown in FIG. 6 is modified from the final defect inspection apparatus 1 in FIG. 2, and generally comprises a host device 10, a microscope 20, a bar code scanner 30, a support tool 40, a signal transceiver 51, an electromagnetic pen 53, a signal transmitter 55, a foot pedal 57 and a battery 59. The host device 10, the microscope 20, the bar code scanner 30 and the support tool 40 are similar to those in FIG. 2, and the detailed description is thus omitted. The signal transmitter 55 is provided on the support plate 27 of the microscope 20 and electrically connected to the signal transceiver 51 and the host device 10. The foot pedal 57 is electrically connected to the signal transmitter 55. The battery 59 is provided on the support plate 27, and used to supply electrical power for the signal transmitter 55.

Figure 7:
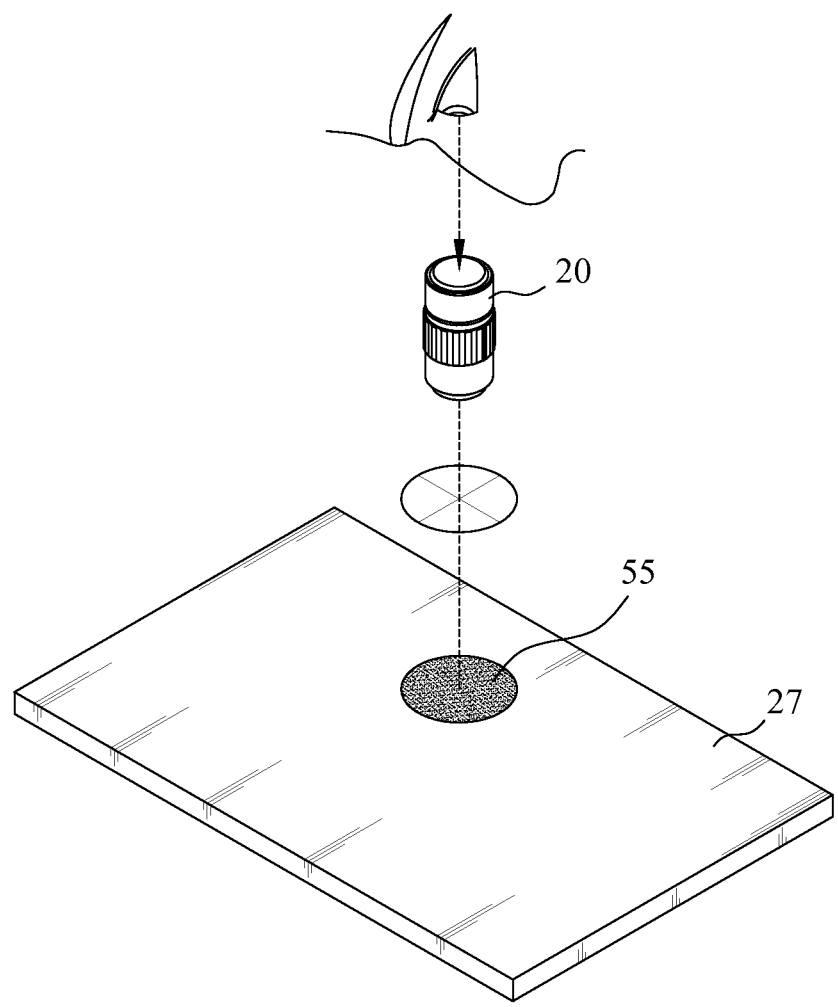
FIG. 7 is a view showing the calibration process used in the final defect inspection apparatus.

Meanwhile, refer to FIG. 7. In the step S15, a cross region seen from the microscope 20 and the signal transmitter 55 are aligned and then the foot pedal 57 is stamped such that the microscope 20 is positioned to correspond with the signal transmitter 55, and the signal transmitter 57 transmits a positioning signal to the host device 10 to finish calibration positioning. Additionally, the final inspection apparatus 2 may further comprise a laser pen (no shown) provided on a support frame 25 of the microscope 20 to generate a light spot used to enhance illumination intensity. That is, the foot pedal 57 is stamped when the cross region seen from the microscope 20 is aligned with the signal transmitter 55 as well as the light spot is aligned with the cross region, thereby finishing calibration positioning for the final inspection apparatus 2.

The step 20 is similar to that of the first embodiment, that is, the bar code 120 on the circuit board 100 is scanned by the bar code scanner 20, and the host device 10 selects data and a circuit layout diagram from the database corresponding to the bar code 120.

In the step S35, the support plate 27 of the microscope 20 is moved until the cross region seen from the microscope 20 is aligned with two points (such as upper-left and lower-right points) of a diagonal line on the circuit board 100 provided on the support tool 40. Then the foot pedal 57 is stamped to generate a plurality of original aligned positions. The signal transceiver 51 receives and transmits the original aligned positions to the host device 10, which defines an outline of the circuit board 100 based on the original aligned positions and the circuit layout diagram, and specifies one point on the circuit board 100 as the original point.

The step 40 is similar to that of the first embodiment, that is, the support plate 27 is moved and the eye lens 21 and the at least one object lens 23 of the microscope 20 are used to inspect whether any defect exists in a plurality of inspection regions 110 preset on the circuit board 100. The defect position is the inspection region 110 where any defect is found is specified. In the step S55, the cross region seen from the microscope 20 is aligned with each defect position, and then the foot pedal 57 is stamped to generate a defect aligned position or a plurality of defect aligned positions. In the step S60, the host device 10 calculates each coordinate of a scrap region based on a relative position between the original point and each defect aligned position, and then generates the shipment file, which contains each coordinate of the scrap region.

Additionally, the signal transmitter 55 and the foot pedal 57 are electrically connected to the host device 10 through wired or wireless connection. More specifically, the wireless connection is implemented by ultrasonic waves, BLUETOOTH™ or infrared rays.

Apparently from the above detailed description for the present invention, one aspect of the present invention is that it is possible to use the host device, the bar code scanner, the signal transceiver and the electromagnetic pen to automatically read the data related to the circuit board and to calculate the marked defect position so as to avoid data input error and data mismatch problem for the manually marked position and the data input to the computer. The traditional black pen or white paint pen is thus totally replaced and the risk of pollution for the processing pieces is greatly improved.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method of final defect inspection, comprising steps of:
    preparing a final defect inspection apparatus, which comprises a host device having a database, a microscope, a bar code scanner electrically connected to the host device, a support tool for supporting a circuit board to be inspected, a signal transceiver provided on the support tool and electrically connected to the host device, and an electromagnetic pen;
    scanning a bar code on the circuit board by using the bar code scanner, wherein the host device selects data and a circuit layout diagram from the database corresponding to the bar code;
    calibrating an original point by using the electromagnetic pen to scribe a diagonal line on the circuit board so as to generate a plurality of original mark positions, wherein the signal transceiver receives and transmits the original mark positions to the host device such that the host device defines an outline of the circuit board based on the original mark positions and the circuit layout diagram, and specifies one point on the circuit board as the original point;
    inspecting any defect by disposing the support tool provided with the circuit board and the signal transceiver on a support plate of the microscope, moving the support plate and using an eye lens and at least one object lens of the microscope to inspect whether any defect exists in a plurality of inspection regions preset on the circuit board, wherein a defect position is the inspection region where any defect is found is specified;
    marking the defect by using the electromagnet pen to make a mark on each defect position, wherein the signal transceiver receives and transmits each defect position to the host device; and
    generating a shipment file by using the host device, which calculates each coordinate of a scrap region based on a relative position between the original point and each defect position, and then generates a shipment file containing each coordinate of the scrap region.

2. The method as claimed in claim 1, wherein the eye lens has a magnification of 10× to 100×, and the at least one object lens has a magnification of 1× to 10×.

3. The method as claimed in claim 1, wherein the host device and the bar code scanner are connected through wired or wireless connection, and the host device and the signal transceiver are connected through wired or wireless connection.

4. The method as claimed in claim 3, wherein the wireless connection is implemented by wireless LAN (local area network).

5. The method as claimed in claim 1, wherein the signal transceiver and the electromagnetic pen are connected through wired or wireless connection, and the wireless connection is implemented by ultrasonic waves, or infrared rays.

6. The method as claimed in claim 1, wherein the support tool comprises a base and a support piece, the base has a recess part to accommodate the substrate plate, and the support piece has a recess part to support the circuit board.

7. A method of final defect inspection, comprising steps of:
    preparing a final defect inspection apparatus, which comprises a host device having a database, a microscope, a bar code scanner connected to the host device, a support tool for supporting a circuit board to be inspected, a signal transceiver provided on the support tool and electrically connected to the host device, a signal transmitter provided on a support plate of the microscope and electrically connected to the signal transceiver and the host device, and a foot pedal electrically connected to the signal transmitter;
    calibrating the final inspection apparatus by aligning a cross region seen from the microscope and the signal transmitter and then stamping the foot pedal, wherein the microscope is positioned to correspond with the signal transmitter, and the signal transmitter transmits a positioning signal to the host device;
    scanning a bar code on the circuit board by using the bar code scanner, wherein the host device selects data and a circuit layout diagram from the database corresponding to the bar code;
    calibrating an original point by moving the support plate of the microscope until the cross region seen from the microscope is aligned with two points of a diagonal line on the circuit board provided on the support tool, and then stamping the foot pedal to generate a plurality of original aligned positions, wherein the signal transceiver receives and transmits the original aligned positions to the host device, and the host device defines an outline of the circuit board based on the original aligned positions and the circuit layout diagram, and specifies one point on the circuit board as the original point;

inspecting any defect by moving the support plate and using an eye lens and at least one object lens of the microscope to inspect whether any defect exists in a plurality of inspection regions preset on the circuit board, wherein a defect position is the inspection region where any defect is found is specified;

confirming the defect position by aligning the cross region seen from the microscope and each defect position, and then stamping the foot pedal to generate a defect aligned position or a plurality of defect aligned positions; and generating a shipment file by using the host device to calculate each coordinate of a scrap region based on a relative position between the original point and each defect aligned position, and to generate a shipment file containing each coordinate of the scrap region.

8. The method as claimed in claim 7, wherein the support tool comprises a base and a support piece, the base has a recess part to accommodate the substrate plate, and the support piece has a recess part to support the circuit board.

9. The method as claimed in claim 7, wherein the final inspection apparatus further comprises a laser pen provided on a support frame of the microscope to generate a light spot used to enhance illumination intensity, wherein the light spot is used to align the cross region and the signal transmitter, and then the foot pedal is stamped to finish calibration positioning during calibrating the final inspection apparatus.

10. The method as claimed in claim 7, wherein the eye lens has a magnification of 10× to 100×, and the at least one object lens has a magnification of 1× to 10×.

11. The method as claimed in claim 7, wherein the host device is connected to the bar code scanner, the signal transceiver, and the signal transmitter through wired or wireless connection.

12. The method as claimed in claim 11, wherein the wireless connection is implemented by wireless LAN.

13. The method as claimed in claim 7, wherein the final inspection apparatus further comprises a battery provided on the support plate of the microscope to supply electrical power for the signal transceiver.

14. The method as claimed in claim 7, wherein the signal transceiver and the signal transmitter are connected through wired or wireless connection, and the wireless connection is implemented by ultrasonic waves, or infrared rays.

\* \* \* \* \*